United States Patent [19]

Noguchi et al.

[11] Patent Number: 5,942,578
[45] Date of Patent: Aug. 24, 1999

[54] ENERGY BEAM CURABLE PRESSURE SENSITIVE ADHESIVE COMPOSITION AND USE THEREOF

[75] Inventors: Hayato Noguchi; Takeshi Kondoh, both of Urawa, Japan

[73] Assignee: Lintec Corp., Japan

[21] Appl. No.: 08/845,046

[22] Filed: Apr. 18, 1997

[30] Foreign Application Priority Data

Apr. 19, 1996 [JP] Japan ................................. 8-098351

[51] Int. Cl.$^6$ .............................. C08L 33/06; C08J 3/28
[52] U.S. Cl. ...................... 525/228; 522/112; 522/182; 522/126; 522/129; 525/227; 525/228; 525/230; 525/108; 525/125; 526/931
[58] Field of Search .................... 522/112, 182; 525/227, 228, 230, 108, 125, 126, 129; 526/931

[56] References Cited

U.S. PATENT DOCUMENTS

| | | | |
|---|---|---|---|
| 4,185,050 | 1/1980 | Lazear et al. | 525/221 |
| 5,098,952 | 3/1992 | Blasko et al. | 525/123 |
| 5,202,361 | 4/1993 | Zimmerman et al. | 522/120 |
| 5,244,962 | 9/1993 | Plamthottam et al. | 524/525 |
| 5,302,629 | 4/1994 | Berejka | 523/111 |

FOREIGN PATENT DOCUMENTS

| | | |
|---|---|---|
| 0104046 | 3/1984 | European Pat. Off. . |
| 0157508 | 10/1985 | European Pat. Off. . |
| 0187044 | 7/1986 | European Pat. Off. . |
| 0295330 | 12/1988 | European Pat. Off. . |
| 60-223139 | 7/1985 | Japan . |
| 05214298 | 8/1993 | Japan . |
| 1373045 | 11/1974 | United Kingdom . |
| 2102011 | 1/1983 | United Kingdom . |

*Primary Examiner*—James J. Seidleck
*Assistant Examiner*—Sanza McClendon
*Attorney, Agent, or Firm*—Webb Ziesenheim Logsdon Orkin & Hanson, P.C.

[57] ABSTRACT

An energy beam curable pressure sensitive adhesive composition is disclosed which comprises at least two energy beam curable copolymers having energy beam polymerizable groups in side chains thereof. This energy beam curable pressure sensitive adhesive composition has satisfactory adhesive strength before the irradiation with energy beam and can be cured by the irradiation with energy beam to a degree such that the amount of adhesive residue remaining on an adherend after peeling is extremely small. Further, the above composition ensures excellent expansibility at the expanding step and excellent recognition at the time of pickup. Still further, the above composition exhibits high work efficiency because of very low pickup strength at the bonding step, irrespective of the execution of the expanding step.

6 Claims, No Drawings

ENERGY BEAM CURABLE PRESSURE SENSITIVE ADHESIVE COMPOSITION AND USE THEREOF

FIELD OF THE INVENTION

The present invention relates to an energy beam curable pressure sensitive adhesive composition and a use thereof. This energy beam curable pressure sensitive adhesive composition exhibits satisfactory adhesive strength to an adherend before the irradiation with energy beam and can be cured by the irradiation with energy beam to a degree such that the amount of adhesive residue remaining on the adherend after peeling is extremely small. Further, the above composition ensures excellent expansibility at the expanding step and excellent recognition at the time of pickup. Still further, the above composition exhibits high work efficiency because of very low pickup strength at the bonding step, irrespective of the execution of the expanding step. Therefore, the energy beam curable pressure sensitive adhesive composition of the present invention is suitable for use executing not only sticking but also peeling thereafter, for example, used in a wafer processing or surface protective pressure sensitive adhesive sheet.

BACKGROUND OF THE INVENTION

A semiconductor wafer of, for example, silicon or gallium arsenide is produced in the form of a large diameter. This wafer is cut and separated (diced) into small element chips and is subjected to the subsequent bonding step and mounting step in which the chips are mounted on lead frames. In this process, the semiconductor wafer undergoes dicing, cleaning, drying, expanding and pickup steps in the state of being attached to a pressure sensitive adhesive sheet and transferred to the subsequent mounting step in which the chips are mounted on lead frames.

Adhesive sheets which are intended for use in the processing steps of wafers, from the dicing step up to the pickup step, are desired to have an adhesive force sufficient to retain wafer and chips thereon during the dicing step, but in the pickup step, they are desired to only retain an adhesive force of such an extent that no adhesive remains on the picked-up chips.

In the efforts for obtaining such a desired pressure sensitive adhesive sheet, Japanese Patent Laid-open Publication Nos. 60(1985)-196956 and 60(1985)-223139 proposed pressure sensitive adhesive sheets each comprising a substrate coated with a pressure sensitive adhesive comprising a low molecular weight compound having at least two photopolymerizable carbon-carbon double bonds in each molecule thereof which can be converted to a three-dimensional netted structure by light irradiation. These proposals are based on the concept that, in a pressure sensitive adhesive tape comprising a radiation transmittable substrate and, applied thereon, a radiation curable pressure sensitive adhesive, the radiation curable compound contained in the pressure sensitive adhesive is cured by irradiation so that the pressure sensitive adhesive comes to have a three-dimensional netted structure to thereby conspicuously lower the fluidity thereof.

The above-mentioned conventional pressure sensitive adhesive sheets have the following particular problems in the expanding and pickup steps.

The expanding step enlarges diced small element piece (chip) spacings to thereby facilitate the pickup of the chips. When the conventional wafer bonding pressure sensitive adhesive sheet capable of minimizing the amount of adhesive residue is used, the curing of the pressure sensitive adhesive layer is advanced to such an extent that the pressure sensitive adhesive layer becomes conspicuously hard. Thus, the sheet extensibility (expansibility) is decreased, thereby causing the attainment of desired chip spacings to be difficult. Illustratively, it occurred that the spacings between chips neighboring each other were not satisfactory to thereby cause recognition failure at the pickup step with the result that operation error was invited.

Further, in the above conventional pressure sensitive adhesive tape, the pressure sensitive adhesive layer becomes so hard as to result in deteriorated chip holding capability. Thus, it occurred that chips were dislocated at the time of pickup to thereby cause pickup failure.

Japanese Patent Laid-open Publication No. 5(1993)-214298 teaches a pressure sensitive adhesive sheet provided with a pressure sensitive adhesive layer having, added thereto, a polyether compound of relatively low molecular weight and an unsaturated oligomer of relatively low molecular weight for rendering the adhesive curable by radiation irradiation. However, when the amount of added low molecular weight component is too large, this pressure sensitive adhesive suffers from lowering of its initial adhesive strength, so that chip scattering would occur at the time of dicing. On the other hand, when the amount of added low molecular weight component is too small, the drawback would be encountered that the reduction of the adhesive strength is unsatisfactory upon radiation irradiation or the amount of adhesive residue is unfavorably large. Therefore, the control of adherent properties was very difficult before and after the radiation irradiation.

OBJECT OF THE INVENTION

Under the above circumstances, the inventors have made extensive and intensive studies with a view toward providing a pressure sensitive adhesive composition which is excellent in curing properties and other functions. As a result, the present invention has been completed.

That is, the present invention has been made in view of the above state of prior art, and an object of the present invention is to provide an energy beam curable pressure sensitive adhesive composition which has satisfactory adhesive strength before the irradiation with energy beam and can be cured by the irradiation with energy beam to a degree such that the amount of adhesive residue remaining on an adherend after peeling is extremely small and which ensures excellent expansibility at the expanding step and excellent recognition at the time of pickup and further exhibits high work efficiency because of very low pickup strength at the bonding step, irrespective of the execution of the expanding step Another object of the present invention is to provide a pressure sensitive adhesive sheet, especially, a wafer processing pressure sensitive adhesive sheet and a surface protective pressure sensitive adhesive sheet in which the above energy beam curable pressure sensitive adhesive composition is utilized.

SUMMARY OF THE INVENTION

The energy beam curable pressure sensitive adhesive composition of the present invention comprises at least two energy beam curable copolymers which have energy beam polymerizable groups in side chains thereof. Preferably, the energy beam curable pressure sensitive adhesive composition of the present invention comprises:

an energy beam curable copolymer of at least 50,000 in molecular weight which has energy beam polymerizable groups in side chains thereof (A), the above energy beam curable copolymer being obtainable by reacting 100 g of an acrylic copolymer (a1) which has functional group containing monomer units with at least 0.12 mol of an energy beam polymerizable group containing compound (a2) which has substituents reactive with the above functional groups, and an energy beam curable copolymer of at least 50,000 in molecular weight which has energy beam polymerizable groups in side chains thereof (B), the above energy beam curable copolymer being obtainable by reacting 100 g of an acrylic copolymer (b1) which has functional group containing monomer units with less than 0.12 mol of an energy beam polymerizable group containing compound (b2) which has substituents reactive with the above functional groups.

A photopolymerization initiator (C) can be added to the above energy beam curable pressure sensitive adhesive composition.

The pressure sensitive adhesive sheet of the present invention comprises a substrate coated with the above energy beam curable pressure sensitive adhesive composition and is suitably used as a wafer processing pressure sensitive adhesive sheet or as a surface protective pressure sensitive adhesive sheet.

DETAILED DESCRIPTION OF THE INVENTION

The energy beam curable pressure sensitive adhesive composition of the present invention will be described in detail below.

The energy beam curable pressure sensitive adhesive composition of the present invention comprises at least two energy beam curable copolymers which have energy beam polymerizable groups in side chains thereof. In particular, the energy beam curable pressure sensitive adhesive composition of the present invention comprises a first energy beam curable copolymer (A) and a second energy beam curable copolymer (B) which is different from the copolymer (A) to which a photopolymerization initiator (C) is added according to necessity.

Suitable examples of energy beam curable copolymers (A) and energy beam curable copolymers (B) together with the photopolymerization initiator (C) will be described in detail below.

Energy beam curable copolymer (A)

The first energy beam curable copolymer (A) is obtainable by reacting an acrylic copolymer (a1) which has functional group containing monomer units with an energy beam polymerizable group containing compound (a2) which has substituents reactive with the above functional groups.

The functional group containing monomer is a monomer having in its molecule not only a polymerizable double bond but also a functional group such as a hydroxyl group, a carboxyl group, an amino group, a substituted amino group or an epoxy group. Preferably, a hydroxyl group containing unsaturated compound or a carboxyl group containing unsaturated compound is employed.

Specific examples of the above functional group containing monomers include hydroxyl group containing acrylates such as 2-hydroxyethyl acrylate, 2-hydroxyethyl methacrylate, 2-hydroxypropyl acrylate and 2-hydroxypropyl methacrylate; and carboxyl group containing compounds such as acrylic acid, methacrylic acid and itaconic acid.

The above functional group containing monomers may be used either individually or in combination.

The acrylic copolymer (a1) is composed of structural units derived from the above functional group containing monomer and structural units derived from a (meth)acrylate monomer or a derivative thereof. Suitable (meth)acrylate monomer is, for example, a cycloalkyl (meth)acrylate, benzyl (meth)acrylate or an alkyl (meth)acrylate in which the alkyl group has 1 to 18 carbon atoms. Of these, an alkyl (meth)acrylate in which the alkyl group has 1 to 18 carbon atoms is preferred which is, for example, methyl acrylate, methyl methacrylate, ethyl acrylate, ethyl methacrylate, propyl acrylate, propyl methacrylate, butyl acrylate or butyl methacrylate.

The acrylic copolymer (a1) generally contains the above structural units derived from the functional group containing monomer in an amount of 1 to 100% by weight, preferably, 2 to 80% by weight and, still preferably, 3 to 50% by weight and contains the above structural units derived from the (meth)acrylate monomer or derivative thereof in an amount of 0 to 99% by weight, preferably, 20 to 98% by weight and, still preferably, 50 to 97% by weight.

The acrylic copolymer (a1) is obtained by copolymerizing the above functional group containing monomer with the above (meth)acrylate monomer or derivative thereof according to the conventional procedure. In this copolymerization, a small amount (for example, 10% by weight or less, preferably, 5% by weight or less) of another monomer such as vinyl formate, vinyl acetate or styrene may be used in addition to the above monomers.

The energy beam curable copolymer (A) is obtainable by reacting the above acrylic copolymer (a1) which has functional group containing monomer units with an energy beam polymerizable group containing compound (a2) which has substituents reactive with the above functional groups.

The energy beam polymerizable group containing compound (a2) contains substituents reactive with the functional groups of the acrylic copolymer (a1). This substituent is various depending on the type of the above functional group. For example, when the functional group is a hydroxyl or carboxyl group, the substituent is preferred to be an isocyanate or epoxy group. When the functional group is an amino or a substituted amino group, the substituent is preferred to be an isocyanate group or the like. When the functional group is an epoxy group, the substituent is preferred to be a carboxyl group. One substituent is contained in every molecule of energy beam polymerizable group containing compound (a2).

Further, 1 to 5, preferably, 1 to 2 energy beam polymerizable groups are contained in every molecule of energy beam polymerizable group containing compound (a2).

Examples of suitable energy beam polymerizable groups include a carbon-carbon double bond group, a carbon-carbon triple bond group and an epoxy group. Of these, a carbon-carbon double bond group is preferred.

Specific examples of the above energy beam polymerizable group containing compounds (a2) include:

methacryloyloxyethyl isocyanate, m-isopropenyl-α,α-dimethylbenzyl isocyanate, methacryloyl isocyanate and allyl isocyanate;

acryloyl monoisocyanate compounds each obtained by reacting a diisocyanate or polyisocyanate compound with hydroxyethyl (meth)acrylate;

acryloyl monoisocyanate compounds each obtained by reaction of a mixture of a diisocyanate or polyisocyanate compound, a polyol compound and hydroxyethyl (meth)acrylate;

glycidyl (meth)acrylate; and (meth)acrylic acid.

The energy beam polymerizable group containing compound (a2) is generally used in an amount of at least 0.12 mol, preferably, from 0.12 to 1.0 mol and, still preferably, from 0.12 to 0.5 mol per 100 g (solid contents) of the above acrylic copolymer (a1).

Further, the energy beam polymerizable group containing compound (a2) is generally used in an amount of 20 to 100 equivalents, preferably, 45 to 95 equivalents and, still preferably, 60 to 90 equivalents per 100 equivalents of the above functional group containing monomer of the acrylic copolymer (a1).

The reaction between the acrylic copolymer (a1) and the energy beam polymerizable group containing compound (a2) is generally conducted at 20 to 50° C. under atmospheric pressure over a period of about 24 hr. It is preferred that this reaction be effected in a solution, for example, an ethyl acetate solution in the presence of a catalyst such as dibutyltin laurate.

As a result, the functional group present in the side chain of the acrylic copolymer (a1) reacts with the substituent of the energy beam polymerizable group containing compound (a2), so that the energy beam polymerizable group is introduced in the side chain of the acrylic copolymer (a1), thereby obtaining the energy beam curable copolymer (A). In this reaction, the reactivity between the functional group and the substituent is generally at least 80%, preferably in the range of about 90 to 100%. Unreacted functional group may remain in the energy beam curable copolymer (A).

The energy beam curable copolymer (A) has a molecular weight of at least 50,000, preferably, from 70,000 to 1,500,000 and, still preferably, from 100,000 to 1,000,000. The energy beam curable copolymer (A) generally has a glass transition temperature of up to 20° C., preferably, about −70 to 0° C. The energy beam curable copolymer (A) exhibits adherence at room temperature (23° C.).

The above energy beam curable copolymer (A) contains the energy beam polymerizable group, so that the irradiation with energy beam causes the energy beam curable copolymer (A) to undergo polymerization and curing with the result that the adherence thereof is lost.

Energy beam curable copolymer (B)

The second energy beam curable copolymer (B) is obtainable by reacting the acrylic copolymer (b1) which has functional group containing monomer units with the energy beam polymerizable group containing compound (b2) which has substituents reactive with the above functional groups in the same manner as mentioned above. Specific examples of the acrylic copolymers (b1) are the same as those of the acrylic copolymers (a1) listed above.

Specific examples of the energy beam polymerizable group containing compounds (b2) are the same as those of the energy beam polymerizable group containing compounds (a2) listed above. However, the energy beam curable copolymer (B) has a formulation which is different from that of the energy beam curable copolymer (A). Preferably, the energy beam curable copolymer (B) is different from the energy beam curable copolymer (A) in the amount of energy beam polymerizable group containing compound (b2) used.

In the preparation of the energy beam curable copolymer (B), the energy beam polymerizable group containing compound (b2) is generally used in an amount of less than 0.12 mol, preferably, from 0.01 to less than 0.12 mol and, still preferably, from 0.02 to less than 0.12 mol per 100 g (solid contents) of the above acrylic copolymer (b1).

Further, the energy beam polymerizable group containing compound (b2) is generally used in an amount of 20 to 100 equivalents, preferably, 45 to 95 equivalents and, still preferably, 60 to 90 equivalents per 100 equivalents of the above functional group containing monomer of the acrylic copolymer (b1).

The reaction between the acrylic copolymer (b1) and the energy beam polymerizable group containing compound (b2) is conducted under the same conditions as mentioned above.

As a result, the functional group present in the side chain of the acrylic copolymer (b1) reacts with the substituent of the energy beam polymerizable group containing compound (b2), so that the energy beam polymerizable group is introduced in the side chain of the acrylic copolymer (b1), thereby obtaining the energy beam curable copolymer (B). In this reaction, the reactivity between the functional group and the substituent is generally at least 80%, preferably in the range of about 90 to 100%. Unreacted functional group may remain in the energy beam curable copolymer The energy beam curable copolymer (B) has a molecular weight of at least 50,000, preferably, from 70,000 to 1,500,000 and, still preferably, from 100,000 to 1,000,000. The energy beam curable copolymer (B) generally has a glass transition temperature of up to 20° C., preferably, about −70 to 0° C. The energy beam curable copolymer (B) exhibits adherence at room temperature (23° C.).

The above energy beam curable copolymer (B) contains the energy beam polymerizable group, so that the irradiation with energy beam causes the energy beam curable copolymer (B) to undergo polymerization and curing with the result that the adherence thereof is reduced.

Although can be arbitrarily set, the weight ratio of the component of energy beam curable copolymer (A) to the component of energy beam curable copolymer (B) in the energy beam curable pressure sensitive adhesive composition is preferred to range from 1/100 to 100/1, especially, from 1/50 to 50/1 and, still especially, from 1/10 to 10/1 (A/B).

Photopolymerization initiator (C)

When ultraviolet rays are employed as the energy beam, the polymerization/curing time and the energy beam dosage can be reduced by mixing a photopolymerization initiator (C) in the above composition of the present invention.

Specific examples of suitable photopolymerization initiators (C) include benzophenone, acetophenone, benzoin, benzoin methyl ether, benzoin ethyl ether, benzoin isopropyl ether, benzoin isobutyl ether, benzoin benzoic acid, benzoin methyl benzoate, benzoin dimethyl ketal, 2,4-diethylthioxanthone, 1-hydroxycyclohexyl phenyl ketone, benzyl diphenyl sulfide, tetramethylthiuram monosulfide, azobisisobutyronitrile, benzil, dibenzyl, diacetyl and β-chloroanthraquinone. It is preferred that the photopolymerization initiator (C) be used in an amount ranging from 0.1 to 10 parts by weight, especially, from 0.5 to 5 parts by weight per 100 parts by weight of the sum of the components (A) and (B).

Other components

In addition to the above components (A) and (B) and optionally added component (C), an acrylic polymer having widely been used as a pressure sensitive adhesive can be used in the energy beam curable pressure sensitive adhesive composition of the present invention in an amount which is not detrimental to the objects of the present invention. The above acrylic polymer does not contain any energy beam polymerizable group, so that itself has no photopolymerizability. This acrylic polymer is, for example, a homopolymer of a (meth)acrylic ester, a copolymer whose main structural monomer units are based on a (meth)acrylic ester or a mixture thereof. This (meth)acrylic ester is preferred to be an alkyl (meth)acrylate in which the alkyl group has 1 to 18 carbon atoms. In addition to this monomer, a comonomer such as vinyl acetate, styrene or vinyl chloride may be used in the copolymerization.

The acrylic polymer has a molecular weight of at least 100,000, preferably, from 150,000 to 1,500,000 and, still preferably, from 200,000 to 1,000,000. The acrylic polymer generally has a glass transition temperature of up to 20° C., preferably, about −70 to 0° C. The acrylic polymer exhibits adherence at room temperature (23° C.).

The above acrylic polymer may be added to the composition of the present invention in an amount of, preferably, up to 100 parts by weight and, still preferably, up to 50 parts by weight per 100 parts by weight of the sum of the components (A) and (B).

Further, an energy beam polymerizable compound of low molecular weight can be added to the energy beam curable pressure sensitive adhesive composition in order to control the energy beam curability thereof.

The above energy beam polymerizable compound has a molecular weight of not greater than 10,000, preferably, from about 100 to 8000.

The energy beam polymerizable compound of low molecular weight which can be used in the present invention is, for example, an acrylate monomer, a urethane acrylate oligomer, an epoxy-modified urethane acrylate oligomer or an epoxy acrylate oligomer.

The energy beam polymerizable compound of low molecular weight may be added to the composition of the present invention in an amount of 0 to 100 parts by weight, preferably, about 0.1 to 10 parts by weight per 100 parts by weight of the sum of the components (A) and (B). When the amount of the energy beam polymerizable compound of low molecular weight is too large, the expansion of the composition would be unfavorably difficult after curing.

Still further, an organic polyvalent isocyanate compound, an organic polyvalent epoxy compound, an organic polyvalent imine compound or the like can be added to the energy beam curable pressure sensitive adhesive composition of the present invention in order to regulate the initial adhesive strength and cohesive strength of the composition before the energy beam irradiation.

The above organic polyvalent isocyanate compound is, for example, an aromatic polyvalent isocyanate compound, an aliphatic polyvalent isocyanate compound, an alicyclic polyvalent isocyanate compound, a trimer of each of these polyvalent isocyanate compounds or an isocyanate terminated urethane prepolymer obtained by reacting each of these polyvalent isocyanate compounds with a polyol compound. Specific examples of suitable organic polyvalent isocyanate compounds include 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate and lysine isocyanate.

The above organic polyvalent epoxy compound is, for example, a bisphenol A epoxy compound, a bisphenol F epoxy compound, 1,3-bis(N,N-diglycidylaminomethyl) benzene, 1,3-bis(N,N-diglycidylaminomethyl)toluene, N,N, N',N'-tetraglycidyl-4,4-diaminodiphenylmethane.

The above organic polyvalent imine compound is, for example, N,N'-diphenylmethane- 4,4'-bis(1-aziridinecarboxyamide), trimethylolpropane-tri-β-aziridinyl propionate, tetramethylolmethane-tri-β-aziridinyl propionate and N,N'-toluene-2,4-bis(1-aziridinecarboxyamido) triethylenemelamine.

Energy beam curable pressure sensitive adhesive composition

The energy beam curable pressure sensitive adhesive composition of the present invention is obtainable by blending together the above energy beam curable copolymers (A) and (B) optionally along with the photopolymerization initiator (C) and above other components according to the conventional technique.

The above energy beam curable pressure sensitive adhesive composition can be cured by the irradiation with energy beam to a degree such that the amount of adhesive residue remaining on an adherend after peeling is extremely small. Further, the joint use of at least two polymers which have energy beam polymerizable groups in side chains thereof ensures excellent expansibility at the expanding step and excellent recognition at the time of pickup. Still further, the above composition of the present invention exhibits high work efficiency because of very low pickup strength at the bonding step, irrespective of the execution of the expanding step. Suitable examples of the energy beams include ultraviolet rays and electron beams. The energy beam dosage is varied depending on the type of applied energy beam. For example, when ultraviolet rays are used, the dosage thereof is preferred to range from about 40 to 200 W/cm. When electron beams are used, the dosage thereof is preferred to range from about 10 to 1000 krad. This energy beam irradiation realizes a marked reduction of the adhesive strength of the composition of the present invention. For example, whereas the adhesive strength to a specular surface of semiconductor wafer ranges from about 100 to 1000 g/25 mm before the energy beam irradiation, control can be effected so that the adhesive strength after the energy beam irradiation is about 0.5 to 50% of that before the energy beam irradiation.

Use

The above energy beam curable pressure sensitive adhesive composition of the present invention exhibits satisfactory adhesive strength to an adherend before the irradiation with energy beam and, on the other hand, can be cured by the irradiation with energy beam to a degree such that the amount of adhesive residue is extremely small. Therefore, this energy beam curable pressure sensitive adhesive composition is suitable for use in applications in which peeling is effected after sticking.

The energy beam curable pressure sensitive adhesive sheet of the present invention comprises a substrate coated with a pressure sensitive adhesive layer composed of the above energy beam curable pressure sensitive adhesive composition.

The substrate for use in the energy beam curable pressure sensitive adhesive sheet of the present invention is, for example, selected from among general-purpose films such as polyethylene, polypropylene, polybutene, polybutadiene, polymethylpentene, polyvinyl chloride, vinyl chloride copolymer, polyethylene terephthalate, polybutylene terephthalate, polyurethane, ethylene/vinyl acetate copolymer, ionomer resin, ethylene/(meth)acrylic acid copolymer, ethylene/(meth)acrylic acid ester copolymer, polystyrene and polycarbonate films and laminates thereof.

When the energy beam curable pressure sensitive adhesive sheet is used in the wafer processing including the expanding step, it is preferred that the above substrate have a Young's modulus ranging from 250 to 5000 dyne/cm, especially, from 270 to 3000 dyne/cm and, still especially, from 300 to 1500 dyne/cm. However, when the energy beam curable pressure sensitive adhesive sheet is used in the wafer processing including no expanding step, the Young's modulus of the substrate is not particularly limited.

When ultraviolet rays are used as the energy beam, it is preferred that a film whose transmission of light of 300 to 400 nm in wavelength is at least 5%, especially, at least 10% and, still especially, at least 15% be used as the substrate.

When electron beams are used as the energy beam, it is not necessary for the substrate to be transparent. Thus, each of not only the aforementioned transparent films but also opaque films obtained by coloring them and fluororesin films can be used as the substrate.

The energy beam curable pressure sensitive adhesive sheet of the present invention can be obtained by coating a variable substrate in appropriate thickness with the above energy beam curable pressure sensitive adhesive composition according to the conventional technique employing a comma coater, gravure coater, die coater, reverse coater or the like and drying the composition to thereby form a pressure sensitive adhesive layer on the substrate. When considered necessary, a release sheet is applied onto the pressure sensitive adhesive layer.

Although varied depending on the use, the thickness of the pressure sensitive adhesive layer generally ranges from about 1 to 100 µm, preferably, from about 5 to 50 µm and, still preferably, from about 10 to 30 µm.

On the other hand, the thickness of the substrate generally ranges from about 10 to 300 µm, preferably, from about 20 to 200 µm and, still preferably, from about 50 to 150 µm.

The configuration of the energy beam curable pressure sensitive adhesive sheet of the present invention is not limited and the sheet may have the form of, for example, a tape or a label.

When the energy beam curable pressure sensitive adhesive sheet of the present invention having been stuck to an adherend is irradiated with energy beam, the adhesive strength thereof is markedly reduced.

Thus, this sheet can be removed from the adherend without causing adhesive residue to remain on the adherend Therefore, the energy beam curable pressure sensitive adhesive sheet of the present invention is most suitable for use in applications in which peeling is effected after sticking. For example, it is used as a wafer processing or surface protective pressure sensitive adhesive sheet.

The surface protective pressure sensitive adhesive sheet is stuck onto the surface of, for example, a decorative laminate, a glass plate, a metal plate or a plastic plate and protects the same from soiling or scratching during the transit or processing. When the protection is no longer needed, the surface protective pressure sensitive adhesive sheet can easily be peeled off by irradiating it with energy beam.

The wafer processing pressure sensitive adhesive sheet is employed at the time of, for example, polishing the back of a wafer or wafer dicing.

A multiplicity of circuits are formed on a surface of a semiconductor wafer, and semiconductor chips are produced by conducting cutting and separation (dicing) of the semiconductor wafer for each individual circuit. If the thickness of the wafer is irregular or an oxide layer has been formed on the back of the wafer, the obtained chips suffer from performance irregularity. Thus, the back of the wafer is polished after the completion of the wafer processing. However, this may encounter damaging of circuits by polishing debris. In this instance, the sticking of the wafer processing pressure sensitive adhesive sheet of the present invention to a frontal face of the wafer enables preventing the damaging of circuits. Moreover, the wafer processing pressure sensitive adhesive sheet can easily be peeled off by irradiating it with energy beam without causing adhesive residue to remain on the wafer, so that neither is the wafer soiled nor circuit damaging occurs at the time of the peeling.

Likewise, the wafer dicing may encounter damaging of circuits by cutting debris. In this instance as well, the circuits can be protected by the wafer processing pressure sensitive adhesive sheet of the present invention. Further, the wafer processing pressure sensitive adhesive sheet of the present invention can be stuck to the back of the wafer for fixing the wafer so that the wafer is stably, held at the time of dicing. This wafer processing pressure sensitive adhesive sheet of the present invention can hold the wafer with satisfactory adhesive strength before the irradiation with energy beam and has a marked reduction of the adhesive strength upon the irradiation with energy beam after the dicing, so that the semiconductor chips can easily picked up without suffering from soiling by the adhesive. Further, upon the irradiation with energy beam, the pressure sensitive adhesive layer is cured to a degree such that the amount of adhesive residue is extremely small. Furthermore, the joint use of at least two polymers which have energy beam polymerizable groups in side chains thereof ensures excellent expansibility at the expanding step and excellent recognition at the time of pickup in the wafer processing. Still further, the above sheet of the present invention exhibits high work efficiency because of very low pickup strength at the bonding step, irrespective of the execution of the expanding step.

EFFECT OF THE INVENTION

As apparent from the foregoing, the energy beam curable pressure sensitive adhesive composition of the present invention exhibits satisfactory adhesive strength to an adherend before the irradiation with energy beam and can be cured by the irradiation with energy beam to a degree such that the amount of adhesive residue is extremely small. Further, the joint use of at least two polymers which have energy beam polymerizable groups in side chains thereof ensures excellent expansibility at the expanding step and excellent recognition at the time of pickup in the wafer processing. Still further, the above composition of the present invention exhibits high work efficiency because of very low pickup strength at the bonding step, irrespective of the execution of the expanding step. Therefore, the energy beam curable pressure sensitive adhesive composition of the present invention is most suitable for use in applications in which peeling is effected after sticking, for example, a wafer processing or surface protective pressure sensitive adhesive sheet.

EXAMPLE

The present invention will further be illustrated below with reference to the following Examples which in no way limit the scope of the invention.

In the following Examples and Comparative Examples, the "180° peeling adhesive strength", "expansibility", "alignability", "residual particle" and "pickup strength" were evaluated in the following manners.

180° peeling adhesive strength

The pressure sensitive adhesive sheet obtained in each of the following Examples and Comparative Examples was stuck onto the back (polished by #2000) of a semiconductor wafer in 23° C./65% RH atmosphere by reciprocating a 2 kg rubber roller thereon, allowed to stand still for 20 min and peeled by means of a universal tensile tester (TENSILON/ UTM-4-100 manufactured by Orientec Corporation) at a peeling speed of 300 mm/min to thereby determine a 180° peeling adhesive strength. Also, the pressure sensitive adhesive sheet was stuck and allowed to stand still under the same conditions, and was irradiated from the substrate side at a line speed of 5 m/min with ultraviolet rays emitted from a high pressure mercury lamp (80 W/cm) disposed at a distance of 10 cm from the sheet. Thereafter, the 180° peeling adhesive strength was measured in the same manner.

Expansibility

A 5-inch silicon wafer was stuck onto the pressure sensitive adhesive sheet and fitted on a flat frame, and a full cutting thereof was conducted into 10 mm square chips with the use of a 30 μm thick diamond blade. An ultraviolet irradiation was made under the same conditions as in the measurement of 180° peeling adhesive strength, and the sheet was expanded by 10 mm with the use of an expanding jig. At that time, the expansibility of the entire wafer was measured.

Alignability

The chip alignability was evaluated by visual inspection simultaneously with the above measurement of expansibility.

Residual particle

A 4-inch silicon wafer was stuck onto the pressure sensitive adhesive sheet, allowed to stand still for 24 hr and irradiated with ultraviolet rays under the same conditions as in the measurement of 180° peeling adhesive strength. Then, the sheet was peeled and the number of particles remaining on the wafer was measured by the use of a laser surface inspecting instrument (manufactured by Hitachi Electronic Engineering Co.).

Pickup strength

A 6-inch silicon wafer was stuck onto the pressure sensitive adhesive sheet and fitted on a flat frame, and a full cutting thereof was conducted into 10 mm square chips with the use of a 30 μm thick diamond blade. An ultraviolet irradiation was made under the same conditions as in the measurement of 180° peeling adhesive strength. Thereafter, the sheet was fixed without being expanded, and each chip was pushed up from the back of the sheet by means of a push pull gauge having its tip provided with a needle. In this manner, pickup strengths were measured at 10 points and averaged.

The following energy beam curable copolymer (A), energy beam curable copolymer (B), photopolymerization initiator (C), copolymer containing no energy beam polymerizable group (D), energy beam polymerizable compound (E) and crosslinking agent (F) were employed in the Examples and Comparative Examples.

Energy beam curable copolymer (A)

A1: product obtained by reacting 100 parts by weight of a 25% ethyl acetate solution of copolymer having weight average molecular weight of 400,000 which was prepared from 60 parts by weight of butyl acrylate, 10 parts by weight of methyl methacrylate and 30 parts by weight of 2-hydroxyethyl acrylate with 7.5 parts by weight (0.19 mol per 100 parts by weight of the copolymer) of methacryloyloxyethyl isocyanate.

A2: product obtained by reacting 100 parts by weight of a 25% ethyl acetate solution of copolymer having weight average molecular weight of 120,000 which was prepared from 60 parts by weight of butyl acrylate, 10 parts by weight of methyl methacrylate and 30 parts by weight of 2-hydroxyethyl acrylate with 7.5 parts by weight (0.19 mol per 100 parts by weight of the copolymer) of methacryloyloxyethyl isocyanate.

Energy beam curable copolymer (B)

B1: product obtained by reacting 100 parts by weight of a 25% ethyl acetate solution of copolymer having weight average molecular weight of 400,000 which was prepared from 90 parts by weight of butyl acrylate and 10 parts by weight of 2-hydroxyethyl acrylate with 2.7 parts by weight (0.07 mol per 100 parts by weight of the copolymer) of methacryloyloxyethyl isocyanate.

B2: product obtained by reacting 100 parts by weight of a 25% ethyl acetate solution of copolymer of having weight average molecular weight of 400,000 which was prepared from 80 parts by weight of butyl acrylate, 15 parts by weight of methyl methacrylate and 5 parts by weight of 2-hydroxyethyl methacrylate with 1.25 parts by weight (0.032 mol per 100 parts by weight of the copolymer) of methacryloyloxyethyl isocyanate.

Photopolymerization initiator (C)

C: 1-hydroxycyclohexyl phenyl ketone (Irgacure 184 produced by Ciba-Geigy).

Copolymer containing no energy beam polymerizable group (D)

D1: 25% ethyl acetate solution of copolymer having weight average molecular weight of 400,000 which was prepared from 90 parts by weight of butyl acrylate and 10 parts by weight of 2-hydroxyethyl acrylate.

D2: 25% ethyl acetate solution of copolymer having weight average molecular weight of 400,000 which was prepared from 80 parts by weight of butyl acrylate, 15 parts by weight of methyl methacrylate and 5 parts by weight of 2-hydroxyethyl methacrylate.

D3: 25% ethyl acetate solution of copolymer having weight average molecular weight of 400,000 which was prepared from 55 parts by weight of butyl acrylate, 40 parts by weight of methyl methacrylate and 5 parts by weight of 2-hydroxyethyl methacrylate.

Energy beam polymerizable compound (E)

E1: dipentaerythritol hexaacrylate.

E2: urethane acrylate oligomer (weight average molecular weight: about 10,000).

Crosslinking agent (F)

F: aromatic polyvalent isocyanate compound (Coronate L produced by Nippon Polyurethane Co.)

EXAMPLE 1

20 parts by weight of component A1, 80 parts by weight of component B1, 1 part by weight of component C and 0.5 part by weight of component F were blended together, thereby obtaining an energy beam curable pressure sensitive adhesive composition. An 80 μm thick ethylene/methacrylic acid copolymer film was coated with the above energy beam curable pressure sensitive adhesive composition so that the coating thickness after drying would be 10 μm and dried at 100° C. for 1 min. Thus, a pressure sensitive adhesive sheet was obtained.

The "180° peeling adhesive strength", "expansibility", "alinability", "residual particle" and "pickup strength" of the obtained pressure sensitive adhesive sheet were evaluated in the above manners. The results are given in Table 1.

EXAMPLE 2

The same procedure as in Example 1 was repeated except that 33 parts by weight of component A1, 67 parts by weight of component B1, 1 part by weight of component C and 0.5 part by weight of component F were blended together. The results are given in Table 1.

EXAMPLE 3

The same procedure as in Example 1 was repeated except that 20 parts by weight of component A1, 80 parts by weight of component B2, 1 part by weight of component C and 0.5 part by weight of component F were blended together. The results are given in Table 1.

EXAMPLE 4

The same procedure as in Example 1 was repeated except that 33 parts by weight of component A1, 67 parts by weight of component B2, 1 part by weight of component C and 0.5 part by weight of component F were blended together. The results are given in Table 1.

EXAMPLE 5

The same procedure as in Example 1 was repeated except that 20 parts by weight of component A2, 80 parts by weight of component B1, 1 part by weight of component C and 0.5 part by weight of component F were blended together. The results are given in Table 1.

EXAMPLE 6

The same procedure as in Example 1 was repeated except that 20 parts by weight of component A2, 80 parts by weight of component B2, 1 part by weight of component C and 0.5 part by weight of component F were blended together. The results are given in Table 1.

EXAMPLE 7

The same procedure as in Example 1 was repeated except that 20 parts by weight of component A1, 80 parts by weight of component B1, 1 part by weight of component C, 5.0 parts by weight of component E1 and 0.5 part by weight of component F were blended together. The results are given in Table 1.

EXAMPLE 8

The same procedure as in Example 1 was repeated except that 20 parts by weight of component A1, 80 parts by weight of component B1, 1 part by weight of component C, 5.0 parts by weight of component E2 and 0.5 part by weight of component F were blended together. The results are given in Table 1.

COMPARATIVE EXAMPLE 1

The same procedure as in Example 1 was repeated except that component A1 was not used and component B1 was used in an amount of 100 parts by weight. The results are given in Table 1.

COMPARATIVE EXAMPLE 2

The same procedure as in Example 3 was repeated except that component A1 was not used and component B2 was used in an amount of 100 parts by weight. The results are given in Table 1.

COMPARATIVE EXAMPLE 3

The same procedure as in Example 1 was repeated except that component B1 was not used and component A1 was used in an amount of 100 parts by weight. The results are given in Table 1.

COMPARATIVE EXAMPLE 4

The same procedure as in Example 5 was repeated except that component B1 was not used and component A2 was used in an amount of 100 parts by weight. The results are given in Table 1.

COMPARATIVE EXAMPLE 5

The same procedure as in Example 1 was repeated except that 1 part by weight of component C, 45 parts by weight of component D1, 55 parts by weight of component E1 and 0.5 part by weight of component F were blended together. The results are given in Table 1.

COMPARATIVE EXAMPLE 6

The same procedure as in Example 1 was repeated except that 1 part by weight of component C, 45 parts by weight of component D2, 55 parts by weight of component E2 and 0.5 part by weight of component F were blended together. The results are given in Table 1.

COMPARATIVE EXAMPLE 7

The same procedure as in Example 1 was repeated except that 1 part by weight of component C, 45 parts by weight of component D3, 55 parts by weight of component E1 and 0.5 part by weight of component F were blended together. The results are given in Table 1.

COMPARATIVE EXAMPLE 8

The same procedure as in Example 1 was repeated except that 70 parts by weight of component A1, 1 part by weight of component C, 30 parts by weight of component D2 and 0.5 part by weight of component F were blended together. The results are given in Table 1.

COMPARATIVE EXAMPLE 9

The same procedure as in Example 1 was repeated except that 30 parts by weight of component A1, 1 part by weight of component C, 70 parts by weight of component D2 and 0.5 part by weight of component F were blended together. The results are given in Table 1.

TABLE 1

| | Pressure sensitive adhesive composition (parts by weight) | | | | | | | | | | |
|---|---|---|---|---|---|---|---|---|---|---|---|
| | (A1) | (A2) | (B1) | (B2) | (C) | (D1) | (D2) | (D3) | (E1) | (E2) | (F) |
| Ex. 1 | 20 | 0 | 80 | 0 | 1.0 | 0 | 0 | 0 | 0 | 0 | 0.5 |
| Ex. 2 | 33 | 0 | 67 | 0 | 1.0 | 0 | 0 | 0 | 0 | 0 | 0.5 |
| Ex. 3 | 20 | 0 | 0 | 80 | 1.0 | 0 | 0 | 0 | 0 | 0 | 0.5 |
| Ex. 4 | 33 | 0 | 0 | 67 | 1.0 | 0 | 0 | 0 | 0 | 0 | 0.5 |
| Ex. 5 | 0 | 20 | 80 | 0 | 1.0 | 0 | 0 | 0 | 0 | 0 | 0.5 |
| Ex. 6 | 0 | 20 | 0 | 80 | 1.0 | 0 | 0 | 0 | 0 | 0 | 0.5 |
| Ex. 7 | 20 | 0 | 80 | 0 | 1.0 | 0 | 0 | 0 | 5 | 0 | 0.5 |
| Ex. 8 | 20 | 0 | 80 | 0 | 1.0 | 0 | 0 | 0 | 0 | 5 | 0.5 |
| Comp. Ex. 1 | 0 | 0 | 100 | 0 | 1.0 | 0 | 0 | 0 | 0 | 0 | 0.5 |
| Comp. Ex. 2 | 0 | 0 | 0 | 100 | 1.0 | 0 | 0 | 0 | 0 | 0 | 0.5 |
| Comp. Ex. 3 | 100 | 0 | 0 | 0 | 1.0 | 0 | 0 | 0 | 0 | 0 | 0.5 |
| Comp. Ex. 4 | 0 | 100 | 0 | 0 | 1.0 | 0 | 0 | 0 | 0 | 0 | 0.5 |
| Comp. Ex. 5 | 0 | 0 | 0 | 0 | 1.0 | 45 | 0 | 0 | 55 | 0 | 0.5 |
| Comp. Ex. 6 | 0 | 0 | 0 | 0 | 1.0 | 0 | 45 | 0 | 0 | 55 | 0.5 |
| Comp. Ex. 7 | 0 | 0 | 0 | 0 | 1.0 | 0 | 0 | 45 | 55 | 0 | 0.5 |
| Comp. Ex. 8 | 70 | 0 | 0 | 0 | 1.0 | 0 | 30 | 0 | 0 | 0 | 0.5 |
| Comp. Ex. 9 | 30 | 0 | 0 | 0 | 1.0 | 0 | 70 | 0 | 0 | 0 | 0.5 |

| | Adhesive strength (g/25 mm) | | Pickup | | | Residual particle |
|---|---|---|---|---|---|---|
| | Before UV irradiation | After UV irradiation | strength 10 mm □/g | Expansibility (%) | Alignability | (no./4 inch wafer) |
| Ex. 1 | 150 | 20 | 430 | 6 | good | 21 |
| Ex. 2 | 180 | 20 | 380 | 5 | good | 25 |
| Ex. 3 | 220 | 20 | 480 | 4 | good | 16 |
| Ex. 4 | 220 | 30 | 420 | 5 | good | 15 |
| Ex. 5 | 180 | 50 | 450 | 5 | good | 30 |
| Ex. 6 | 240 | 40 | 490 | 3 | good | 25 |
| Ex. 7 | 240 | 5 | 470 | 4 | good | 11 |
| Ex. 8 | 250 | 20 | 420 | 5 | good | 13 |
| Comp. Ex. 1 | 200 | 80 | 730 | 2 | good | 120 |
| Comp. Ex. 2 | 250 | 30 | 800 | 1 | good | 30 |
| Comp. Ex. 3 | 300 | 10 | 700 | 1 | good | 18 |
| Comp. Ex. 4 | 280/cf | 30 | 850 | 0.6 | good | 80 |
| Comp. Ex. 5 | 200 | 9 | 590 | 1 | good | 30 |
| Comp. Ex. 6 | 280 | 15 | 680 | 3 | good | 600 |
| Comp. Ex. 7 | 350 | 7 | 650 | 0.7 | good | 15 |
| Comp. Ex. 8 | 300 | 25 | 850 | 7 | good | 50 |
| Comp. Ex. 9 | 250 | 150 | 900 | 8 | good | ≧10000 |

What is claimed is:

1. An energy beam curable pressure sensitive adhesive composition comprising a first energy beam curable copolymer of at least about 50,000 in weight average molecular weight which has energy beam polymerizable groups in side chains thereof, said first energy beam curable copolymer obtained by reacting about 100 g of an acrylic copolymer which has functional group containing monomer units with at least about 0.12 mol of an energy beam polymerizable group containing compound which has substituents reactive with said functional groups; and a second energy beam curable copolymer of at least about 50,000 in weight average molecular weight which has energy beam polymerizable groups in side chains thereof, said second energy beam curable copolymer obtained by reacting about 100 g of an acrylic copolymer which has functional group containing monomer units with less than about 0.12 mol of an energy beam polymerizable group containing compound which has substituents reactive with said functional groups.

2. The energy beam curable pressure sensitive adhesive composition as claimed in claim 1, which further comprises a photopolymerization initiator.

3. A pressure sensitive adhesive sheet comprising a substrate coated with the energy beam curable pressure sensitive adhesive composition of claim 1.

4. The energy beam curable pressure sensitive adhesive composition as claimed in claim 1, further including at least one of an organic polyvalent isocyanate compound, an organic polyvalent epoxy compound or an organic polyvalent imine compound.

5. The pressure sensitive adhesive sheet as claimed in claim 3, which is used as a wafer processing pressure sensitive adhesive sheet.

6. The pressure sensitive adhesive sheet as claimed in claim 3, which is used as a surface protective pressure sensitive adhesive sheet.

* * * * *

UNITED STATES PATENT AND TRADEMARK OFFICE
CERTIFICATE OF CORRECTION

PATENT NO.    : 5,942,578
DATED         : August 24, 1999
INVENTOR(S)   : Hayato Noguchi and Takeshi Kondoh It is certified that error appears in the above-identified patent and that said Letters Patent is hereby corrected as shown below:

Title page,
Under References Cited, U.S. PATENT DOCUMENTS, insert :
-- 4,338,227    7/1982    Ballard         524/143
   4,376,845   3/1983    Metzger         525/196
   5,100,963   3/1992    Lin             525/221
   5,384,341   1/1995    Itagaki et al.  522/111 --.

Title page,
Under References Cited, FOREIGN PATENT DOCUMENTS, insert:
-- 08027239    1/1998    Japan --.

Column 2,
Line 51, after "step" insert period -- . --.

Column 9,
Line 52, after "on the adherend" insert period -- . --.

Column 10,
Line 24, between "stably" and "held" delete comma -- , --.

Signed and Sealed this

Twenty-eighth Day of August, 2001

Attest:

NICHOLAS P. GODICI
*Attesting Officer*    *Acting Director of the United States Patent and Trademark Office*